(12) United States Patent
Flores Delgado

(10) Patent No.: US 11,976,943 B2
(45) Date of Patent: May 7, 2024

(54) METHOD FOR PROCESSING CONTINUOUS SENSOR SIGNALS, AND SENSOR SYSTEM

(71) Applicant: Robert Bosch GmbH, Stuttgart (DE)

(72) Inventor: Ivan Flores Delgado, Stuttgart (DE)

(73) Assignee: ROBERT BOSCH GMBH, Stuttgart (DE)

( * ) Notice: Subject to any disclaimer, the term of this patent is extended or adjusted under 35 U.S.C. 154(b) by 680 days.

(21) Appl. No.: 16/633,207

(22) PCT Filed: May 24, 2018

(86) PCT No.: PCT/EP2018/063667
§ 371 (c)(1),
(2) Date: Jan. 23, 2020

(87) PCT Pub. No.: WO2019/020244
PCT Pub. Date: Jan. 31, 2019

(65) Prior Publication Data
US 2021/0156714 A1 May 27, 2021

(30) Foreign Application Priority Data
Jul. 25, 2017 (DE) .......................... 102017212715.5

(51) Int. Cl.
*G01D 1/18* (2006.01)
(52) U.S. Cl.
CPC ..................................... *G01D 1/18* (2013.01)
(58) Field of Classification Search
CPC ........... G01D 1/14; G01D 1/18; H03M 1/007; H03M 1/127
See application file for complete search history.

(56) References Cited

U.S. PATENT DOCUMENTS

| | | | |
|---|---|---|---|
| 4,749,986 A | 6/1988 | Otani et al. | |
| 5,302,950 A * | 4/1994 | Johnson | H03M 1/1265 341/123 |
| 5,673,210 A * | 9/1997 | Etter | G11B 20/1876 |
| 5,815,101 A * | 9/1998 | Fonte | H03M 1/0629 341/123 |
| 6,621,443 B1 * | 9/2003 | Selli | G06F 3/05 341/110 |

(Continued)

FOREIGN PATENT DOCUMENTS

| | | |
|---|---|---|
| AT | 400776 B | 3/1996 |
| CN | 1543114 A | 11/2004 |

(Continued)

OTHER PUBLICATIONS

International Search Report for PCT/EP2018/063667, dated Sep. 3, 2018.

*Primary Examiner* — Kyle R Quigley
(74) *Attorney, Agent, or Firm* — NORTON ROSE FULBRIGHT US LLP; Gerard A. Messina

(57) ABSTRACT

A method for processing continuous sensor signals of a sensor in which a sensor signal is sampled at a sampling frequency and a series of sampled values able to be classified in terms of time is generated in this way, the sampling frequency is dynamically adapted to the spectral signal properties of the sensor signal variable over time and an item of time information is allocated to the thereby generated sampled values, which allows an allocation of the sampled values in terms of time.

16 Claims, 9 Drawing Sheets

(56) References Cited

U.S. PATENT DOCUMENTS

| | | |
|---|---|---|
| 7,292,168 B2 | 11/2007 | Wesselink et al. |
| 9,281,832 B1 | 3/2016 | Thiagarajan |
| 2003/0031281 A1* | 2/2003 | Ferguson .......... H03H 17/0294 375/350 |
| 2003/0173983 A1* | 9/2003 | Ansari .................. G01D 5/165 324/691 |
| 2007/0081617 A1* | 4/2007 | Fudge ...................... H04B 1/28 375/350 |
| 2008/0084916 A1 | 4/2008 | Hsieh |
| 2009/0043571 A1* | 2/2009 | Nhu ......................... H04N 5/46 704/211 |

FOREIGN PATENT DOCUMENTS

| | | |
|---|---|---|
| CN | 103278235 A | 9/2013 |
| CN | 103634006 A | 3/2014 |
| CN | 104598762 A | 5/2015 |
| CN | 104635045 A | 5/2015 |
| CN | 104901697 A | 9/2015 |
| CN | 105491615 A | 4/2016 |
| CN | 106500829 A | 3/2017 |
| CN | 106918741 A | 7/2017 |
| DE | 69724973 T2 | 5/2004 |
| DE | 69924557 T2 | 2/2006 |
| DE | 102005021358 A1 | 11/2006 |
| DE | 102007043927 A1 | 3/2009 |
| DE | 102008017974 A1 | 10/2009 |
| DE | 102011081409 B3 | 2/2013 |
| DE | 102011088346 A1 | 6/2013 |
| DE | 102013209902 A1 | 12/2013 |
| DE | 102015213314 A1 | 1/2017 |
| DE | 102016015217 A1 | 6/2017 |
| EP | 0063274 A1 | 10/1982 |
| EP | 2503357 A1 | 9/2012 |
| TW | 405301 B | 9/2000 |
| WO | 2006037677 A1 | 4/2006 |

* cited by examiner

| W1 | t1=2 |
|----|------|
| W2 | t2=4 |
| W3 | t3=8 |
| W4 | t4=12 |
| W5 | t5=13 |
| W6 | t6=14 |
| W7 | t7=16 |

| W1 | T=2 |
| --- | --- |
| W2 | T=4 |
| W3 | |
| W4 | T=1 |
| W5 | |
| W6 | T=2 |
| W7 | |

METHOD FOR PROCESSING CONTINUOUS SENSOR SIGNALS, AND SENSOR SYSTEM

FIELD OF THE INVENTION

The present invention relates to a method for processing continuous sensor signals from a sensor, and to a sensor system having an apparatus (device or arrangement) for processing sensor signals.

BACKGROUND INFORMATION

The use of an increasingly greater number of sensors in vehicles, mobile devices, in the industry or the home creates new challenges with regard to the construction of the sensors and the evaluation of the sensor signals. For example, in the case of sensor information that is relevant for the safety of the driver of a vehicle, it must be ensured that the information is able to be called up at any time. The easiest possibility of ensuring this is to operate the sensors so that they are activated at all times.

However, this procedure goes hand in hand with a high current consumption, which is frequently not acceptable. Especially with mobile applications or also with a multitude of sensors having energy stores whose exchange is resource-intensive, the sensors are therefore often operated in a duty-cycle mode. As illustrated in FIG. 1, the sensor switches between a normal mode, in which the sensor is active and generates sensor data Wi, and an energy-saving mode (suspend mode), in which the current consumption P is reduced to a minimum P0 that lies considerably below the current consumption P1 during the normal mode phases. The sensor may still be actuated in the energy-saving mode but no longer generates any sensor data.

During a normal mode phase, the sensor supplies an analog signal, which is sampled once or multiple times. If the sensor signal, as illustrated in FIG. 2, is sampled precisely once in each normal mode phase and a corresponding sampled value A is generated, then the sampling frequency of the sensor signal is essentially defined by the duration of a respective energy-saving mode. Conversely, if multiple samplings with corresponding sampled values Ai are carried out in each normal mode phase, as illustrated in FIG. 3, then the sampling frequency of the sensor signal is defined both by the duration of the energy-saving mode phase and the duration of the normal mode phase.

The minimum time interval between two duty cycles, during which the sensor is in the normal mode, is defined by the minimum sampling frequency that is required to reconstruct the sensor signal. According to the Nyquist theorem, this minimum sampling frequency must be selected to be at least twice as large as the maximum expected frequency of the sensor signal so that the entire information content of the sensor signal is able to be reconstructed.

However, the maximum expected frequency of the sensor signal is generally unknown so that the time interval between two duty cycles usually must be selected smaller than would be required for the current sensor signal.

Printed publication WO 2006/037677 A1 discusses a method for reading out sensor data, in which case the sampling rate is selected such that an overflow of a buffer store is avoided.

SUMMARY OF THE INVENTION

The present invention provides a method for processing continuous sensor signals of a sensor having the features described herein and a sensor system having an apparatus (device or arrangement) for processing sensor signals having the features described herein.

According to a first aspect, the present invention thus relates to a method for processing continuous sensor signals of a sensor in which a sensor signal is sampled at a sampling frequency and a series of sampled values able to be classified in terms of time is produced in this way. The sampling frequency is dynamically adapted to the spectral signal properties of the sensor signal varying over time. An item of time information is allocated to the thereby generated sampled values, which allows for the classification of the sampled values in terms of time.

According to a second aspect, the present invention therefore relates to a sensor system having an apparatus (device or arrangement) for processing sensor signals. The sensor system includes a sensor element for acquiring at least one physical measured variable and for converting this measured variable into a continuous electrical sensor signal. In addition, the sensor system includes a sampling apparatus (device or arrangement) for sampling the sensor signal at a predefinable sampling frequency in order to generate sampled values of the sensor signal. Moreover, an apparatus (device or arrangement) for analyzing the spectral signal properties of the sensor signal, an apparatus (device or arrangement) for adapting the sampling frequency as a function of the currently ascertained spectral signal properties of the sensor signal, and an apparatus (device or arrangement) for allocating an item of time information to the sampled values of the sensor signal are provided.

Specific exemplary embodiments are the subject matter of the respective further embodiments and/or further descriptions as described herein.

The present invention allows for a dynamic adaptation of the sampling frequency as a function of the spectral signal properties of the sensor signals that vary over time. In this way the present invention makes it possible to reduce the current consumption without having to tolerate losses in the signal quality. Instead, according to the present invention, the sampling frequency or sampling rate may always be selected in such a way that the reconstruction of the sensor signals remains possible with sufficient accuracy. As a result, it is possible to react to a change in the spectral properties of the sensor signal by a corresponding variation of the sampling frequency. For example, if a maximum frequency in the spectrum of the sensor signal increases or decreases, the sampling frequency is able to be increased or reduced accordingly in order to still allow for the reconstruction of the information content of the sensor signal according to the Nyquist theorem on the one hand, but also to avoid an excessive current consumption due to an excessive sampling frequency on the other hand.

According to a further development of the present method, the spectral signal properties of the sensor signal are determined repeatedly, i.e. in particular at regular time intervals or following a predefinable number of signal samplings. An adaptation of the sampling frequency takes place only if the spectral signal properties have changed significantly. The number of signal samplings after which another determination of the signal properties of the sensor is carried out is able to be varied dynamically. For example, if frequent or significant changes in the spectral signal properties are detected, then the number of signal samplings is able to be increased so that the signal properties of the sensor are determined more frequently. This ensures a rapid reaction to changed environmental conditions or measuring conditions of the sensor, which thus prevents the loss of sensor information.

A significant change in the signal properties may be determined, for instance, when the percentage change in the maximum frequency of the spectrum of the sensor signal exceeds a predefined threshold value.

According to a further development of the present method, the current sampling frequency is reduced if it is greater than twice the currently ascertained bandwidth of the sensor signal by a predefinable first tolerance value. The current sampling frequency is increased if it is lower than twice the currently ascertained bandwidth of the sensor signal by a predefinable second tolerance value. The first and the second tolerance values are variables based on which it is specified at what point a change in the spectral signal properties will be classified as significant.

According to a further development of the present method, in the event of an adaptation, the current sampling frequency is multiplied by a predefinable and/or automatically adaptable adaptation factor. For example, the adaptation factor may depend on how strongly and/or how frequently the spectral signal properties of the sensor signal are changing. The sampling frequency is adjusted in a control loop by an iterative multiplication of the sampling frequency by an adaptation factor.

According to a further development of the present method, the adaptation of the sampling frequency to the currently determined spectral signal properties takes place successively in a plurality of adaptation steps, and the number of adaptation steps is predefinable and/or variable.

According to a further development of the present method, the sampling frequency is varied only within a predefined, restricted frequency range. For example, the sampling frequency is always adapted in such a way that it is greater than a minimum sampling frequency. This represents a lower limit frequency, whereby it is ensured that certain signals or frequency ranges will not be missed under any circumstances. In addition, the sampling frequency is always able to be adapted so that it is lower than a maximum sampling frequency. This therefore represents an upper limit frequency, whereby the current consumption is restricted.

There are basically different possibilities for determining the current spectral properties of the sensor signal. For example, a Fourier transform would be conceivable but also less complex frequency analysis methods.

According to one further development of the present method, the sensor signal is sampled in a predefinable and/or automatically adaptable test time interval at a predefinable and/or automatically adaptable test sampling frequency in order to determine the spectral signal properties. According to one specific embodiment, the test time interval may be a function of the bandwidth of the sensor signal.

Both the duration of the test time intervals and the respective test sampling frequency are advantageously selected as a function of the sensor type and its use, or in other words, as a function of the expected sensor signal properties and the expected changes in the sensor signal properties. For example, an inertial sensor installed in a mobile phone and used for an activity detection supplies a sensor signal that has a maximum frequency of approximately 20 Hz. This sensor signal may be distorted by the ring tone so that the sensor signal has the maximum frequency of the ring tone, i.e. lies in a range of a few kHz. In this case, the duration of the test time intervals and the test sampling frequency are governed by the expected frequency range of the ring tone.

According to a further development of the present method, time stamp information is allocated to each sampled value as time information, which represents the sampling instant at which the respective sampled value was generated. With the aid of the time stamp information, the sensor signal is able to be reconstructed on the basis of the sampled values despite the varying sampling frequency because the acquisition instants of the sampled values are known. According to one specific embodiment, the time stamp information may encompass an item of relative time information which, for instance, includes for each sampled value the time interval to the preceding sampled value. According to further embodiments, however, an absolute item of time information, which is ascertained with the aid of an internal clock generator of the sensor, for example, is allocated to the sampled value. This type of time information allows for the synchronization of the sensor data of multiple and even different sensors as required by many applications in the consumer electronics sector. For instance, the sensor data of an acceleration sensor are able to be combined with the sensor data of a yaw rate sensor in order to ascertain a precise movement in space.

According to one further development of the present method, each sampled value is allocated as time information the sampling frequency based on which the respective sampled value was generated, and/or the change in the sampling frequency if the sampling frequency has been changed. Based on knowledge of the sampling frequency, the time difference between two different sampled values is able to be determined. Additional memory capacity may be saved in that only the changes in the sampling frequency are registered. If no change is ascertained in the sampling frequency, then the previous sampling frequency is utilized for the evaluation.

According to one further development of the present method, the sampled values are filtered with the aid of a signal filter, and in case of an adaptation of the sampling frequency, an adaptation of the filter setting of the signal filter is carried out as well. The signal filter may include a digital filter, in particular a filter for an offset correction or a low-pass filter. The signal is able to be restricted to certain bandwidths.

According to one further development of the present method, a switch is made between the operating mode, i.e. between a normal mode for intervals during which sampled values of the sensor signal are generated, and an energy saving mode for intervals during which no sampled values of the sensor signal are generated. This leads to a considerable reduction in the energy consumption.

According to one further development of the present method, a series of signal values that are equidistant in terms of time and have a predefinable frequency is generated by an interpolation of the sampled values of the sensor signal under consideration of the allocated time information. This allows for a particularly comfortable, external evaluation of the sensor values. Because of the use of signal values that are equidistant in terms of time, the signal output is thereby independent of the actual internal sampling frequency. An external evaluation device thus always receives a signal having a specific, which may be specifiable, frequency.

According to one further development, the sensor system has at least one signal filter for the sampled values of the sensor signal, and an apparatus (device or arrangement) for adapting the filter setting of the at least one signal filter as a function of the current sampling frequency.

According to one further development of the sensor system, it has an operating mode control unit, which is characterized by an apparatus (device or arrangement) for a switch between at least two operating modes as a function of the current sampling frequency, in particular by a switch between a normal mode for intervals during which sampled values of the sensor signal are generated, and an energy saving mode for intervals during which no sampled values of the sensor signal are generated.

According to one further development of the sensor system, it includes an apparatus (device or arrangement) for generating a series of signal values that are equidistant in terms of time and have a predefinable frequency through an interpolation of the sampled values of the sensor signal under consideration of the allocated time information.

In all figures, identical or functionally equivalent elements and devices have been provided with the same reference numerals.

DETAILED DESCRIPTION

Figure 1:
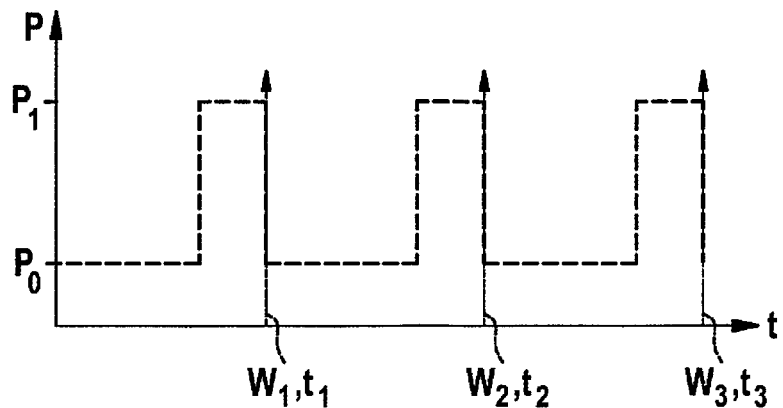
FIG. 1 shows sampling of sensor signals according to the related art, the sensor being operated in a duty cycle mode.
Figure 2:
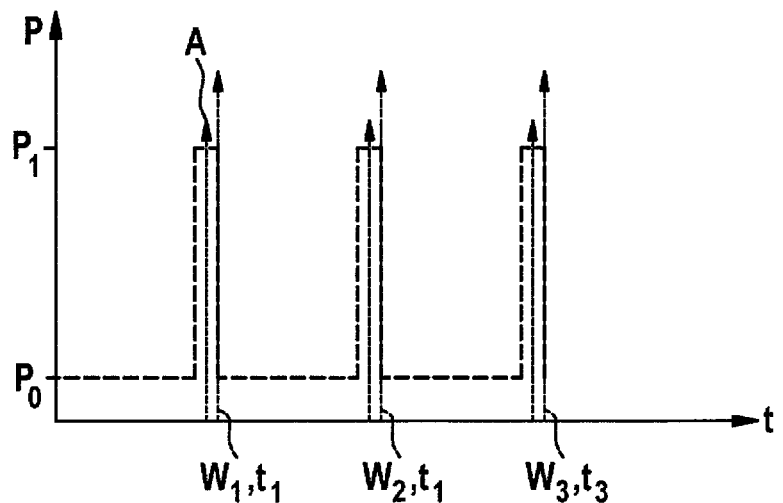
FIG. 2 shows sampling of sensor signals according to the related art, sampling taking place exactly once in each normal mode phase.
Figure 3:
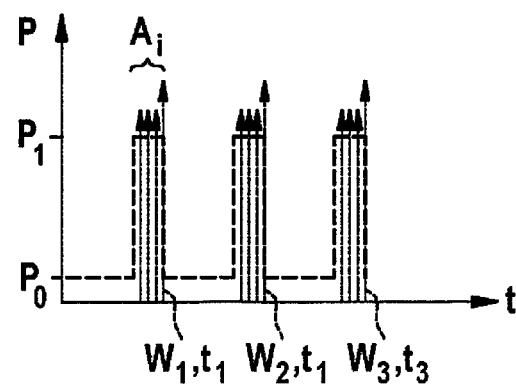
FIG. 3 shows sampling of sensor signals according to the related art, sampling taking place multiple times in each normal mode phase.
Figure 4:
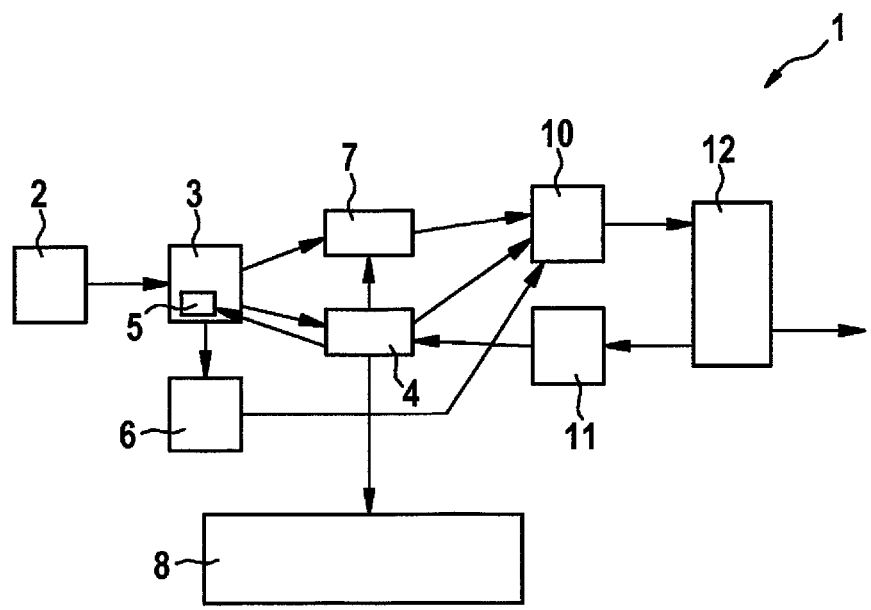
FIG. 4 shows a block diagram of a sensor system according to a specific embodiment of the present invention.

FIG. 4 illustrates a block diagram of a sensor system 1a according to a specific embodiment of the present invention. Sensor system 1a includes a sensor element 2 for acquiring physical measured variables. For instance, sensor element 2 may be an acceleration sensor, a yaw rate sensor, a pressure sensor, a gas sensor or an optical sensor. The physical measured variables acquired by sensor element 2 are converted into a continuous electrical sensor signal. For instance, a deflection of mechanical components is able to be converted via capacitive measuring elements or piezo elements into an electrical voltage or into an electric current.

The continuous electrical sensor signal is sampled by a sampling apparatus (device or arrangement) 3 for sampling the sensor signal. Sampling apparatus (device or arrangement) 3 for sampling the sensor signal may include an analog-to-digital converter, which generates discrete digital sampled values. These sampled values are filtered with the aid of a signal filter 7, whose filter properties may be selected as a function of the sampling frequency. The filtered sampled values are stored in a data register 10. In this way, the filtered sampled values are made available to an interface 12 of sensor system 1a, via which a host system, which is not shown here, is able to gain access to the sampled sensor values.

According to the present invention, the sampling frequency is dynamically adapted to the spectral signal properties of the sensor signal. For this purpose, sensor system 1a has an analyzing apparatus (device or arrangement) 4 for analyzing the spectral signal properties of the sensor signal, which particularly has a processor or multiple processors for carrying out the required computational steps. The analyzing apparatus (device or arrangement) 4 may be configured to determine a bandwidth of the sensor signal with the aid of a frequency analysis. In addition, an ascertaining apparatus (device or arrangement) 4 ascertains a maximum frequency of the sensor signal based on the sampled values of the sensor signal. In the exemplary embodiment described here, the analyzing apparatus (device or arrangement) 4 is configurable via interface 12. Corresponding configuration parameters are stored in a configuration register 11 for this purpose and made available in this way to the analyzing apparatus (device or arrangement) 4 for analyzing the spectral signal properties of the sensor signal.

The ascertained spectral signal properties are also stored in a data memory of sensor system 1a. In the exemplary embodiment described here, data register 10 is used for this purpose again. However, it is also possible to provide a separate data memory for the respective currently ascertained signal properties of the sensor signal.

Sensor system 1a furthermore includes an adapting apparatus (device or arrangement) 5 for adapting the sampling frequency, which particularly may be integrated into sampling apparatus (device or arrangement) 3 for sampling the sensor signal. Adapting apparatus (device or arrangement) 5 for adapting the sampling frequency receives the ascertained spectral signal properties and dynamically adapts the sampling frequency. Like analyzing apparatus (device or arrangement) 4 for analyzing the spectral signal properties of the sensor signal, adapting apparatus (device or arrangement) 5 is configurable by specifying configuration parameters via configuration register 11. For example, an upper and/or a lower limit frequency may be externally predefined for the sampling rate in order to specify a maximum current consumption and to ensure that certain signals will not be missed under any circumstances. Optionally, it is also possible to externally set other parameters such as tolerance parameters in order to realize a more conservative or more aggressive adaptation of the sampling frequency, or parameters that determine how fast an adaptation of the sampling frequency should occur. This will be described in greater detail in connection with FIG. 8.

For example, according to one specific embodiment, it may first be checked whether the spectral signal properties have changed significantly. An exemplary criterion may be that the bandwidth has changed by a predefined percentage.

A significant change may also be determined by comparing the currently ascertained bandwidth with the current sampling frequency. In this way, the sampling frequency is able to be reduced or increased precisely when the sampling frequency exceeds or undershoots the currently ascertained bandwidth by corresponding tolerance values. When a change in the sampling frequency is encountered, then the filter properties of signal filter 7 are adapted as well.

According to the present invention, sensor system 1a also has an allocating apparatus (device or arrangement) 6 for allocating an item of time information to the sampled values of the sensor signal. They may include a clock generator or receive time information from a clock generator.

Sensor system 1a shown in FIG. 4 finally also includes an operating mode control device 8 whose function will be described in greater detail in the following text in connection with FIG. 5.

All elements of sensor system 1a may be integrated into a sensor component. Alternatively, however, the evaluation and/or the adaptation of the sampling frequency may be carried out via an external control device.

Figure 5:
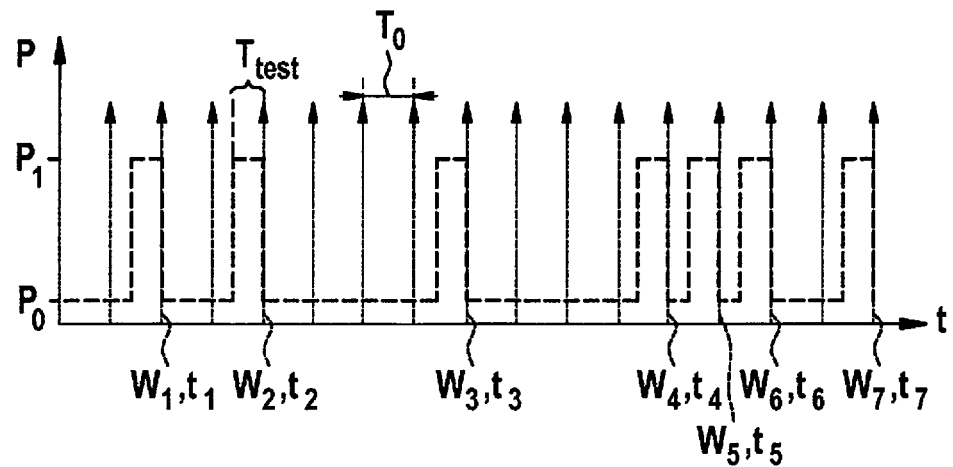
FIG. 5 shows an exemplary sampling pattern according to a specific embodiment of the present invention to describe the dynamic adaptation of the sampling rate.

FIG. 5 illustrates an exemplary sampling pattern. According to the present invention, the sampling frequency, and thus also the duration of the energy saving mode, are dynamically adapted to the context-dependent change in the sensor signal over time. In this instance, operating mode control unit 8 of sensor system 1a is configured to switch between two operating modes, i.e. between an energy saving mode and a normal mode. By default, sensor element 2 is in the energy saving mode in which no sensor signal is generated and therefore no sampling is carried out either. The corresponding required power P0 is minimal but still allows for an actuation of the sensor element. In a switch to the normal mode, sensor element 2 is activated and generates the continuous electrical sensor signal. Required power P1 is increased in comparison with the energy saving mode. In this instance, sampling of the sensor signal takes place at end instant ti of each normal mode phase and supplies corresponding sensor data Wi. To limit the current consumption, a maximum sampling rate is predefined or, similarly, a minimum time interval T0 between two sampling instants ti at which corresponding sampled values Wi are generated.

In the exemplary embodiment illustrated here, the duration of the activation corresponds to a predefinable time interval Ttest, within which the current spectral signal properties of the sensor signal are able to be determined anew in each case. The time span between two test time intervals amounts to a multiple of minimum time interval T0. Here, the sampling frequency for generating the sampled values corresponds to the frequency of the switch between the energy saving mode and the normal mode. According to the present invention, the sampling frequency, and thus the relationship of the normal mode to the energy saving mode in terms of time, is dynamically adapted. Toward this end, the spectral signal properties of the acquired sensor signal are analyzed on a continuous basis in order to reconfigure the sampling rate, the duration of the normal mode phases or duty cycles and the filter settings and to adapt them to the analyzed spectral signal properties.

Figure 6:
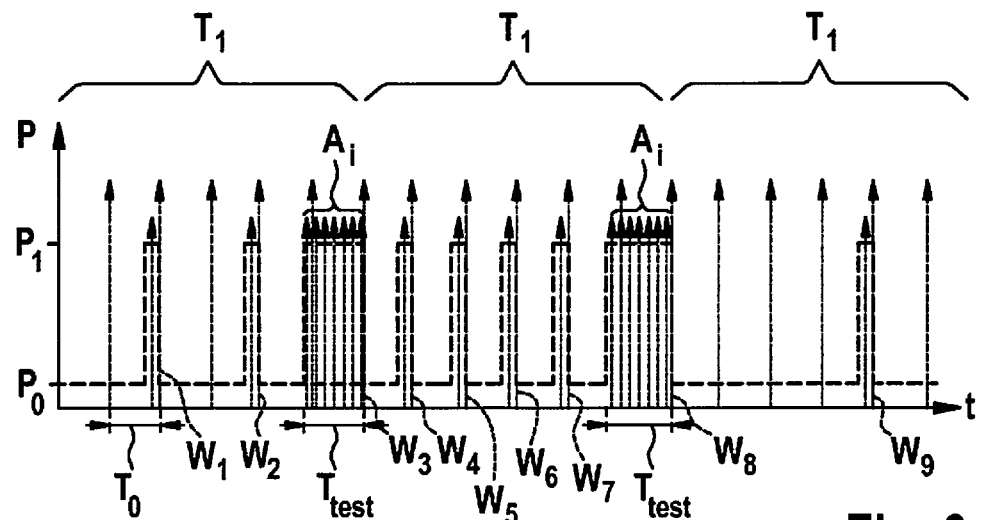
FIG. 6 shows an exemplary sampling pattern according to a specific embodiment of the present invention, in which sampling at a test sampling frequency is carried out at regular time intervals.

FIG. 6 illustrates another exemplary sampling pattern; here, oversampling at a test sampling frequency is carried out at regular time intervals in order to ascertain the spectral signal properties of the sensor signal. As in the case of FIG. 5, sensor element 2 is set to the normal mode only during the sampling operation. To begin with, sensor element 2 is first operated at a predefined starting sampling frequency. Following a fixedly predefined time interval T1, oversampling at an increased test sampling frequency takes place, and corresponding sampled test values Ai are generated. According to additional specific embodiments, the test sampling frequency of the oversampling, the length of test time intervals Ttest and/or the frequency of the oversampling, i.e. time interval T1 between test intervals Ttest, are able to be varied, which may be under consideration of the ascertained bandwidth of the sensor signal. Based on corresponding sampled test values Ai, analyzing apparatus (device or arrangement) 4 analyzes the spectral signal properties of the sensor signal and ascertains the current bandwidth of the sensor signal.

If the analysis of sampled test values Ai reveals that the spectral properties of the sensor signal have changed only slightly, then the sampling rate may be maintained or be reduced as the case may be. This can be the case in particular if the signal bandwidth is smaller than half of the sampling frequency. However, if a significant change in the spectral properties of the sensor signal is detected within the test time interval, e.g., if the signal bandwidth is greater than half the sampling frequency, then the sampling frequency will be increased. This makes it possible to dynamically and iteratively adapt the sampling rate to the signal curve of the sensor signal or to the change in the sensor signal over time. As a result, the sensor signal is able to be sampled at the required frequency but not more often.

The calculations required for analyzing the signal properties and for adapting the sampling frequency are able to be carried out during a normal mode phase or during an energy saving mode phase. The calculations may take place immediately after the sensor signal has been sampled so that they may extend from a normal mode phase at least partially to the following energy saving mode phase.

Figure 7:
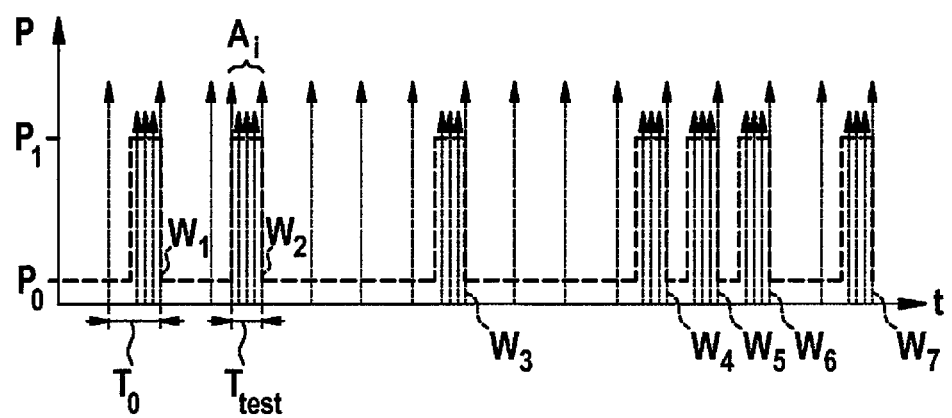
FIG. 7 shows an exemplary sampling pattern according to a specific embodiment of the present invention, in which sampling is carried out at a test sampling frequency during each normal mode phase.

FIG. 7 illustrates another exemplary sampling pattern; here, too, sensor element 2 is always activated, i.e. set to the normal mode, only for sampling the sensor signal. In this exemplary embodiment, the sensor signal is sampled at the increased test sampling frequency during each normal mode phase. As a result, sampled test values Ai are generated and analyzed for each normal mode phase in order to ascertain the spectral signal properties of the sensor signal and the corresponding current bandwidth of the sensor signal. This makes it possible to dynamically adapt the sampling rate following each individual normal mode phase.

Figure 8:
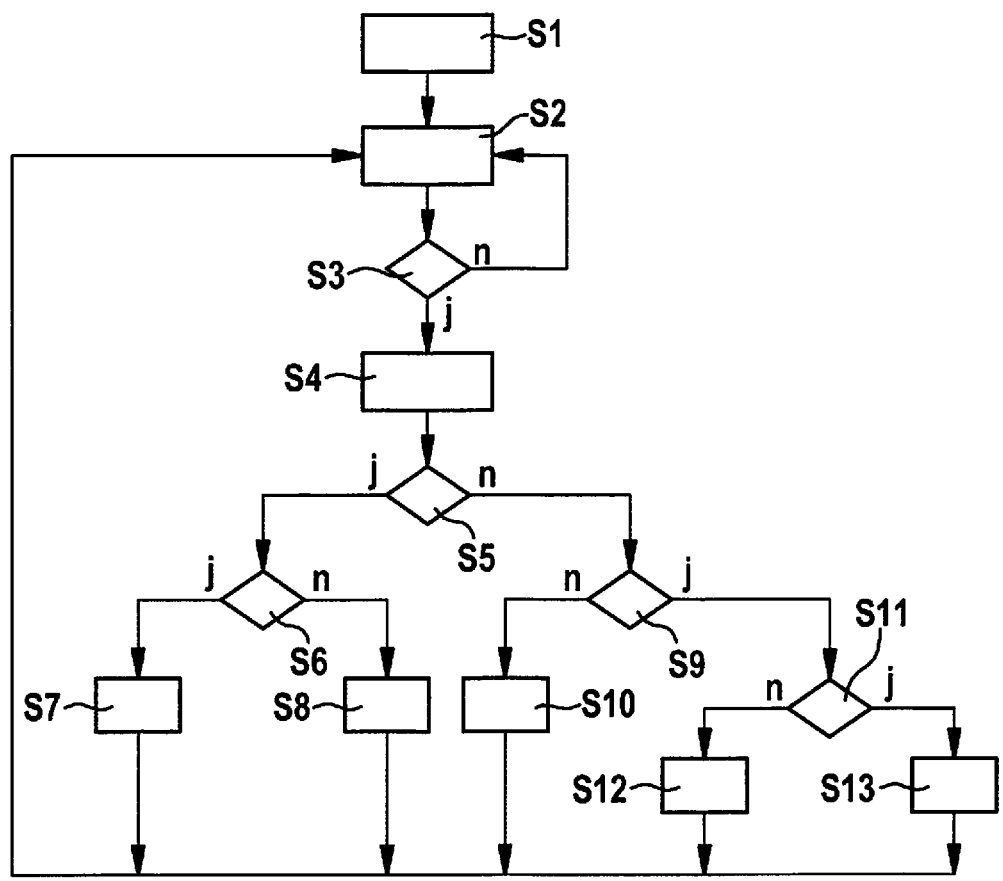
FIG. 8 shows a flow diagram of a method for processing continuous sensor signals according to a specific embodiment of the present invention.

FIG. 8 illustrates a flow diagram of an exemplary method for processing continuous sensor signals for a sensor 2, which may be able to be carried out using described sensor system 1a.

In a first method step S1, the starting values for a plurality of used parameters are specified. Accordingly, a minimum sampling frequency, a maximum sampling frequency, a starting value of the sampling frequency, a duration of a test time interval, a value for the test sampling frequency, a first tolerance value, a second tolerance value, a first adaptation factor and a second adaptation factor are specified. All parameters are able to be stored in configuration memory 11. In addition, the current sampling frequency is set to the starting value of the sampling frequency.

In a second method step S2, a wait takes place for new data of a test time interval. In a method step S3, it is checked whether new data of a test time interval are available, i.e. whether new sampled test values were ascertained. If this is the case, then a frequency analysis of the sensor signal based on the sampled test values is carried out in a method step S4. In particular the bandwidth of the sensor signal is ascertained.

In a method step S5, it is checked whether the current sampling frequency is greater than twice the bandwidth by the first tolerance value. If this is the case, then it is checked in a method step S6 whether the current sampling frequency is lower than a maximum sampling frequency. If this is the case, then the sampling frequency will be reduced in a step S7. For example, the current sampling frequency is reduced to the sum of twice the bandwidth and the first adaptation factor.

If, on the other hand, the current sampling frequency is not lower than the maximum sampling frequency, then the sampling frequency will not be changed and a warning message is optionally output to the effect that the current sampling frequency is too high (S8).

If the current sampling frequency is not greater than twice the currently ascertained bandwidth by a predefinable first tolerance value, then it is checked in a method step S9 whether the current sampling frequency is lower than twice the currently ascertained bandwidth of the sensor signal by a predefinable second tolerance value. If this is not the case, then the current sampling frequency remains unchanged (S10). In the other case, it is checked whether the current sampling frequency is greater than the minimum sampling frequency (S11). If this is not the case, then the current sampling frequency is maintained and a warning is optionally able to be output to the effect that the current sampling frequency is too low (S12). In the other case, the sampling frequency will be increased (S13). For example, the current sampling frequency may be set to the sum of twice the bandwidth and the second adaptation factor.

In a change of the sampling rate, the sampling is continued at the new sampling frequency. In addition, signal filter 7 and operating mode control unit 8 are able to be newly configured using the new sampling frequency. The changed configurations may be stored in configuration memory 11.

Figure 9:
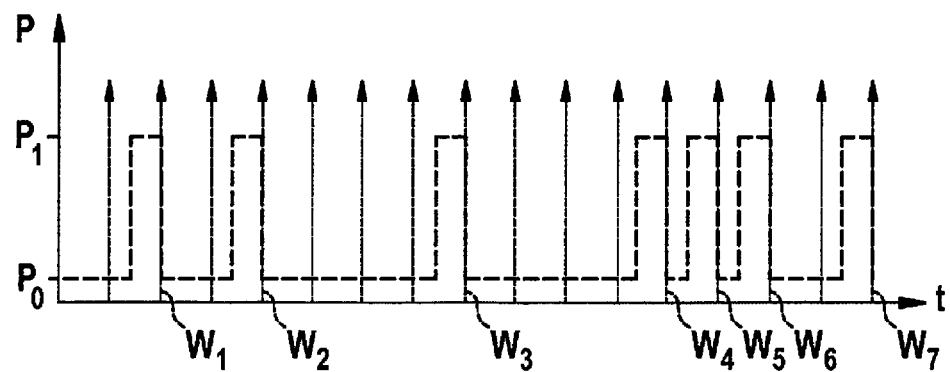
FIG. 9 shows an exemplary dynamic adaptation of the sampling frequency, in which respective sampling instants are allocated to the sampled values.
Figure 9:
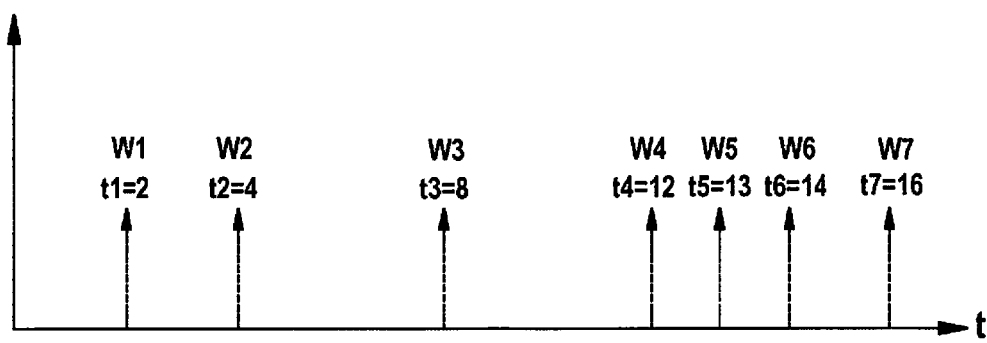

FIG. 9 illustrates an exemplary allocation of time information. Accordingly, the respective sampling instant t1 to t7 is allocated to each sampled value W1 to W7. The individual sampled values W1 to W7 are thus provided with time stamps, which include the sampling instant of each read-out sampled value. As a result, a corresponding time allocation and a correct interpretation of the signals are possible. Sampling instant t1 to t7, for instance, may be indicated and stored, e.g., by indicating the number of minimum time intervals T0 starting from a predefined, which may be known starting instant.

According to one specific embodiment, sampled values W1 to W7 are able to be emitted together with sampling instants t1 to t7 via an interface 12 of sensor system 1. Knowledge of sampled values W1 to W7 and sampling instants t1 to t7 makes it possible to reconstruct the correct sequence of sampled values W1 to W7 in terms of time.

Figure 10:
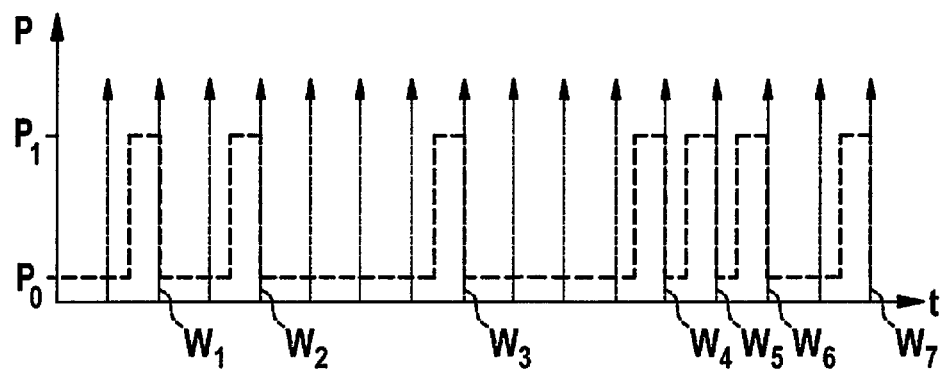
FIG. 10 shows an exemplary, dynamic adaptation of the sampling frequency, in which the change in the sampling frequency is allocated to the sampled values as time information in the event that the sampling frequency changes.
Figure 10:
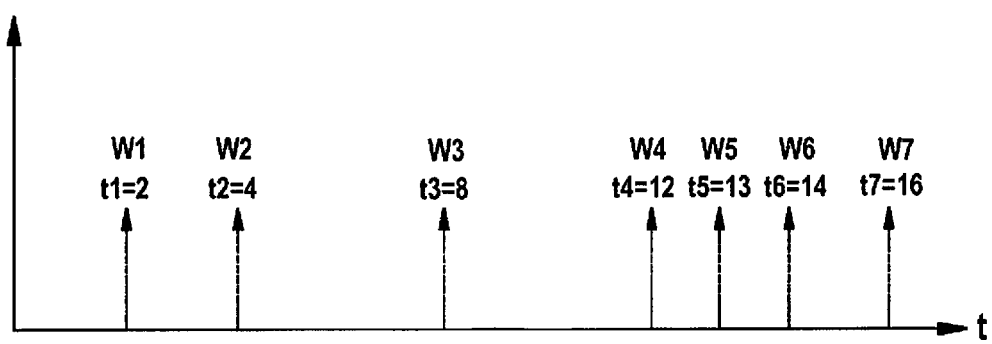

FIG. 10 illustrates a further possible allocation of time information. In this case, the changed sampling frequency is allocated as time information to the particular sampled values W1 to W7 for which the sampling frequency is changed. Rather than the sampling instants, a change in the settings is therefore registered and stored according to this specific embodiment. In this instance, the change in the sampling frequency is registered by indicating the number of minimum time intervals T0 until the next sampling procedure. In the example illustrated in FIG. 10, the sampling frequency is halved following the second sampled value in that the sampling does not take place after two but only after four time intervals T0. After the fourth sampled value, the sampling frequency is increased again so that sampling is carried out in each time interval T0 and is halved again following the sixth sampled value. With knowledge of the change in the sampling frequency, the correct sequence of sampled values W1 to W7 in terms of time is able to be reconstructed.

Figure 11:
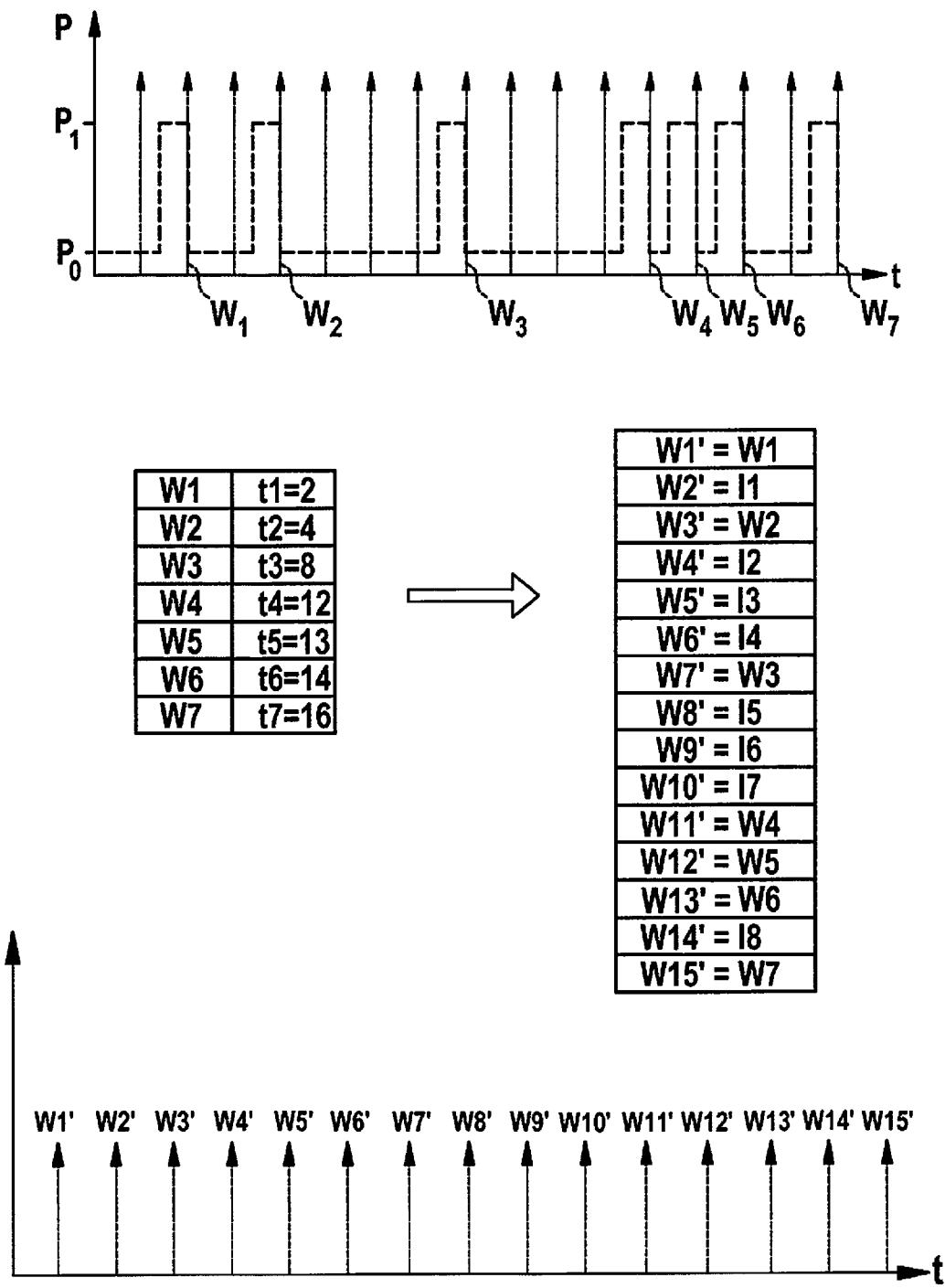
FIG. 11 shows an exemplary, dynamic adaptation of the sampling frequency, in which the sampled values that were not ascertained are interpolated.

FIG. 11 illustrates the sensor signal reconstruction based on a frequency protocol that has been set up, as discussed in connection with FIG. 10. By interpolating the acquired sampled values for the particular multiples of minimum time intervals T0 for which no sampled value is available, a series of signal values Wi' which are equidistant in terms of time is generated. Toward this end, sampled values W1 to W7 used for the interpolation are buffer-stored in a FIFO memory 13 (first in-first out) and supplemented by interpolated sampled values 11 to 18. If the time interval between two signal values Wi' is known, the sampled signal then makes it possible to reconstruct the sensor signal. An external unit that then uses the data of the sensor therefore has no knowledge of the sampling rate at which the sensor signal was actually sampled. The sensor data are thus able to be transmitted to the external unit at the maximally permitted data rate. In particular, the acquired sampled values may first be internally stored. During the reading in, the additional interpolated sampled values 11 to 18 are then generated and correspondingly arranged for the external unit so that it is able to read out the data via an interface. The simplified evaluation of the sensor signal by the external unit is advantageous because it does not require any information about the actual sampling rate.

Figure 12:
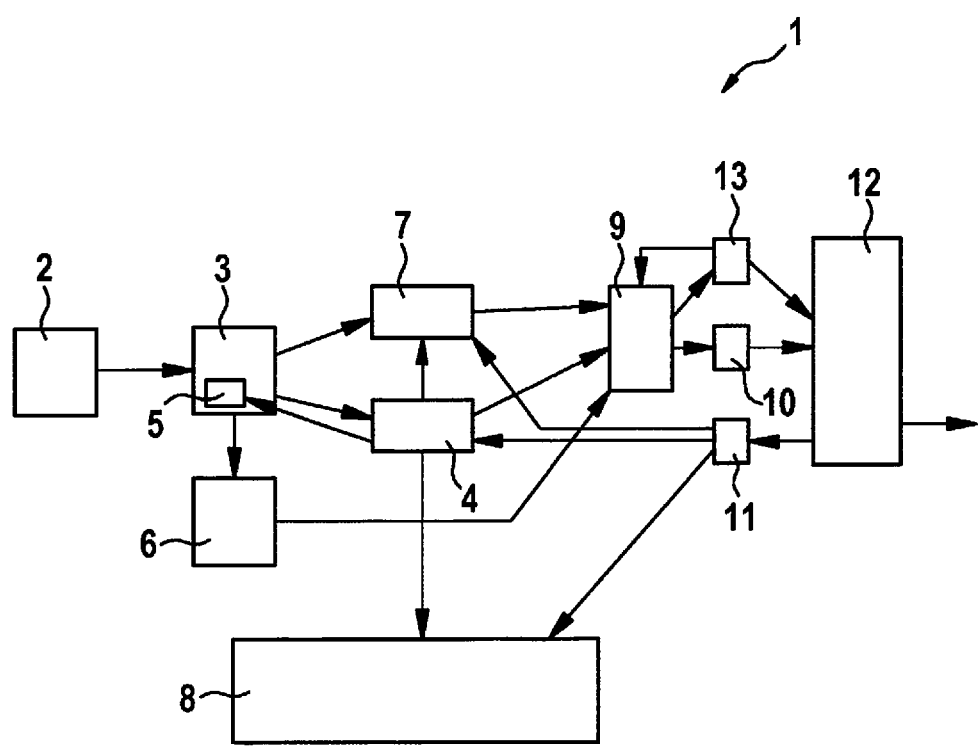
FIG. 12 shows a block diagram of a device for processing continuous sensor data according to a further specific embodiment of the present invention.

FIG. 12 shows a block diagram of a sensor system 1b according to another specific embodiment of the present invention. Sensor system 1b essentially corresponds to sensor system 1a described above. Sensor system 1b additionally includes agenerating apparatus (device or arrangement) 9, which is configured to generate, based on the acquired sampled values, a series of signal values, equidistant in terms of time, at a predefinable frequency, and it includes the afore-described FIFO memory for buffer-storing sampled values W1 to W8. Toward this end, interpolating apparatus/device 9 generates interpolating sampled values 11 to 18 according to the method described in connection with FIG. 11 and generates a series of signal values Wi' on that basis that are equidistant in terms of time.

What is claimed is:

1. A method for processing continuous sensor signals of a sensor, the method comprising:
   specifying starting values for a plurality of parameters, including a minimum sampling frequency, a maximum sampling frequency, a starting value of the sampling frequency, a duration of a test time interval, a value for the test sampling frequency, a first tolerance value, a second tolerance value, a first adaptation factor, and a second adaptation factor, wherein the parameters are stored in a configuration memory;
   sampling, with a sensor device, a sensor signal at the sampling frequency;
   classifying a series of sampled values which are classifiable in terms of time;
   waiting for new data of the test time interval;
   checking whether new data of the test time interval are available because new sampled test values were ascertained, and if so, then a frequency analysis of the sensor signal based on the sampled test values is carried out to ascertain a bandwidth of the sensor signal with a frequency analysis;
   checking whether a current sampling frequency is greater than a multiple of a bandwidth by the first tolerance value, and if so, then it is checked whether the current sampling frequency is lower than a maximum sampling frequency, and if so, then the current sampling frequency is reduced based on the bandwidth and the first adaptation factor, wherein when the current sampling frequency is not lower than the maximum sampling frequency, then the sampling frequency is not changed;

wherein when the current sampling frequency is not greater than the multiple of the bandwidth by the first tolerance value, then it is checked whether the current sampling frequency is lower than the multiple of the bandwidth of the sensor signal by the second tolerance value, and if not, then the current sampling frequency remains unchanged, and if so, it is checked whether the current sampling frequency is greater than the minimum sampling frequency, and if not, then the current sampling frequency is maintained, and if so, the sampling frequency is based on the bandwidth and the second adaptation factor;

ascertaining a maximum frequency of the sensor signal based on the sampled values of the sensor signal;

wherein the sampling frequency is dynamically adapted to the spectral signal properties of the sensor signal varying over time, wherein an item of time information is allocated to the generated sampled values, which allows for the classification of the sampled values in terms of time signal, wherein the sensor device includes a signal filter, which filters the sampled values, wherein the signal filter has filter properties which are selected as a function of the sampling frequency, wherein the upper and/or the lower sampling frequency are externally predefined for the sampling rate to specify a maximum current consumption, wherein to limit the current consumption, the maximum sampling rate is predefined, and the minimum time interval is predefined between two sampling instants, at which corresponding sampled values are generated, and wherein the adaptation factors depend on how strongly and/or how frequently the spectral signal properties of the sensor signal are changing.

2. The method of claim 1, wherein the spectral signal properties of the sensor signal are determined repeatedly, at regular time intervals or following a predefinable number of signal samplings, and an adaptation of the sampling frequency takes place only when the spectral signal properties have changed by at least a specific amount.

3. The method of claim 1, wherein the current sampling frequency is reduced when it is greater than twice the currently ascertained bandwidth of the sensor signal by the first tolerance value, which is a predefinable first tolerance value, and wherein the current sampling frequency is increased when it is lower than twice the currently ascertained bandwidth of the sensor signal by the second tolerance value, which is a predefinable second tolerance value.

4. The method of claim 1, wherein when there is an adaptation, the current sampling frequency is multiplied by a predefinable and/or automatically adaptable adaptation factor.

5. The method of claim 1, wherein the adaptation of the sampling frequency to the currently determined spectral signal properties takes place successively in a plurality of adaptation steps and the number of adaptation steps is predefinable and/or variable.

6. The method of claim 1, wherein the sampling frequency is varied only within a predefined, restricted frequency range.

7. The method of claim 1, wherein the sensor signal is sampled in a predefinable and/or automatically adaptable test time interval at a predefinable and/or automatically adaptable test sampling frequency to determine its spectral signal properties.

8. The method of claim 1, wherein time stamp information is allocated to each sampled value as time information, which represents the sampling instant at which the respective sampled value has been generated.

9. The method of claim 1, wherein each sampled value is allocated as time information the sampling frequency based on which the respective sampled value was generated, and/or the change in the sampling frequency when the sampling frequency has been changed.

10. The method of claim 1, wherein the sampled values are filtered with a signal filter, and wherein when there is adaptation of the sampling frequency, the filter setting of the signal filter is adapted.

11. The method of claim 1, wherein a switch is made between at least two operating modes, i.e. between a normal mode for intervals during which sampled values of the sensor signal are generated, and an energy saving mode for intervals during which no sampled values of the sensor signal are generated.

12. The method of claim 1, wherein a series of signal values that are equidistant in terms of time and have a predefinable frequency is generated through an interpolation of the sampled values of the sensor signal under consideration of the allocated time information.

13. A sensor system, comprising:
a processor to process sensor signals, including a sensor element for acquiring at least one physical measured variable and for converting this measured variable into a continuous electrical sensor signal, and which is configured to perform the following:
specifying starting values for a plurality of parameters, including a minimum sampling frequency, a maximum sampling frequency, a starting value of the sampling frequency, a duration of a test time interval, a value for the test sampling frequency, a first tolerance value, a second tolerance value, a first adaptation factor, and a second adaptation factor, wherein the parameters are stored in a configuration memory;
sampling, with a sensor device, the sensor signal at a predefinable sampling frequency to generate sampled values of the sensor signal;
waiting for new data of the test time interval;
checking whether new data of the test time interval are available because new sampled test values were ascertained, and if so, then a frequency analysis of the sensor signal based on the sampled test values is carried out to ascertain a bandwidth of the sensor signal with a frequency analysis;
checking whether a current sampling frequency is greater than a multiple of a bandwidth by the first tolerance value, and if so, then it is checked whether the current sampling frequency is lower than a maximum sampling frequency, and if so, then the current sampling frequency is reduced based on the bandwidth and the first adaptation factor, wherein when the current sampling frequency is not lower than the maximum sampling frequency, then the sampling frequency is not changed;
wherein when the current sampling frequency is not greater than the multiple of the bandwidth by the first tolerance value, then it is checked whether the current sampling frequency is lower than the multiple of the bandwidth of the sensor signal by a second tolerance value, and if not, then the current sampling frequency remains unchanged, and if so, it is checked whether the current sampling frequency is greater than the minimum sampling frequency, and if not, then the current sampling frequency is maintained, and if so, the sampling frequency is based on the bandwidth and the second adaptation factor;

analyzing the spectral signal properties of the sensor signal;

adapting the sampling frequency as a function of the currently ascertained spectral signal properties of the sensor signal; and allocating an item of time information to the sampled values of the sensor signal;

wherein the sensor device includes a signal filter, which filters the sampled values, wherein the signal filter has filter properties which are selected as a function of the sampling frequency, wherein the sampling frequency is dynamically adapted to the spectral signal properties of the sensor signal varying over time, wherein the analyzing includes determining a bandwidth of the sensor signal with a frequency analysis, and ascertaining a maximum frequency of the sensor signal based on the sampled values of the sensor signal, wherein the upper and the lower sampling frequency are externally predefined for the sampling rate to specify a maximum current consumption, wherein to limit the current consumption, the maximum sampling rate is predefined, and the minimum time interval is predefined between two sampling instants, at which corresponding sampled values are generated, and wherein the adaptation factors depend on how strongly and/or how frequently the spectral signal properties of the sensor signal are changing.

14. The sensor system of claim 13, further comprising:

at least one signal filter, for the sampled values of the sensor signal, in which a filter setting of the at least one signal filter is adapted as a function of the current sampling frequency.

15. The sensor system of claim 13, further comprising:

an operating mode control unit to switch between at least two operating modes as a function of the current sampling frequency, by switching between a normal mode for intervals during which sampled values of the sensor signal are generated and an energy saving mode for intervals during which no sampled values of the sensor signal are generated.

16. The sensor system of claim 13, further comprising:

a generating device to generate a series of signal values that are equidistant in terms of time and have a predefinable frequency through an interpolation of the sampled values of the sensor signal under consideration of the allocated time information.

* * * * *